(12) United States Patent
Bang et al.

(10) Patent No.: US 11,508,635 B2
(45) Date of Patent: Nov. 22, 2022

(54) SEMICONDUCTOR PACKAGE HAVING ROUTABLE ENCAPSULATED CONDUCTIVE SUBSTRATE AND METHOD

(71) Applicant: Amkor Technology Singapore Holding Pte. Ltd, Valley Point (SG)

(72) Inventors: Won Bae Bang, Gyeonggi-do (KR); Byong Jin Kim, Gyeonggi-do (KR); Gi Jeong Kim, Gyeonggi-do (KR); Jae Doo Kwon, Seoul (KR); Hyung Il Jeon, Gyeonggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 29 days.

(21) Appl. No.: 16/861,405

(22) Filed: Apr. 29, 2020

(65) Prior Publication Data

US 2020/0258803 A1    Aug. 13, 2020

Related U.S. Application Data

(62) Division of application No. 16/032,295, filed on Jul. 11, 2018, now Pat. No. 10,685,897, which is a
(Continued)

(30) Foreign Application Priority Data

Sep. 8, 2015 (KR) .......................... 10-2015-0126935

(51) Int. Cl.
*H01L 23/31* (2006.01)
*H01L 23/00* (2006.01)
(Continued)

(52) U.S. Cl.
CPC ...... *H01L 23/3128* (2013.01); *H01L 21/6835* (2013.01); *H01L 23/49579* (2013.01);
(Continued)

(58) Field of Classification Search
CPC . H01L 2224/05017; H01L 2224/05022; H01L 2224/05026; H01L 2224/05567;
(Continued)

(56) References Cited

U.S. PATENT DOCUMENTS

| 7,435,680 B2 * | 10/2008 | Nakamura | ............. | H05K 3/243 |
| | | | | 438/678 |
| 8,357,860 B2 * | 1/2013 | Kaneko | .................. | H05K 1/113 |
| | | | | 174/265 |

(Continued)

FOREIGN PATENT DOCUMENTS

| CN | 101315917 | 12/2008 |
| CN | 104112673 A | 10/2014 |

(Continued)

OTHER PUBLICATIONS

Search Report from China National Intellectual Property Administration CNIPA received Jan. 4, 2021.
(Continued)

*Primary Examiner* — David A Zarneke
(74) *Attorney, Agent, or Firm* — Kevin B. Jackson

(57) ABSTRACT

A packaged semiconductor device includes a routable molded lead frame structure with a surface finish layer. In one embodiment, the routable molded lead frame structure includes a first laminated layer including the surface finish layer, vias connected to the surface finish layer, and a first resin layer covering the vias leaving the top surface of the surface finish layer exposed. A second laminated layer includes second conductive patterns connected to the vias, bump pads connected to the second conductive patterns, and a second resin layer covering one side of the first resin layer, the second conductive patterns and the bump pads. A semiconductor die is electrically connected to the surface finish layer and an encapsulant covers the semiconductor die and another side of the first resin layer. The surface finish layer provides a customizable and improved bonding structure for connecting the semiconductor die to the routable molded lead frame structure.

19 Claims, 15 Drawing Sheets

Related U.S. Application Data division of application No. 15/173,379, filed on Jun. 3, 2016, now Pat. No. 10,049,954.

(51) Int. Cl.

| | | |
|---|---|---|
| *H01L 23/495* | (2006.01) | |
| *H01L 21/683* | (2006.01) | |
| *H01L 23/498* | (2006.01) | |
| *H01L 23/532* | (2006.01) | |
| *H01L 21/48* | (2006.01) | |
| *H01L 23/48* | (2006.01) | |

(52) U.S. Cl.
CPC ........ *H01L 23/49861* (2013.01); *H01L 24/06* (2013.01); *H01L 24/14* (2013.01); *H01L 24/91* (2013.01); *H01L 21/4839* (2013.01); *H01L 21/4846* (2013.01); *H01L 21/4857* (2013.01); *H01L 23/48* (2013.01); *H01L 23/49534* (2013.01); *H01L 23/49537* (2013.01); *H01L 23/49548* (2013.01); *H01L 23/49558* (2013.01); *H01L 23/49586* (2013.01); *H01L 23/49816* (2013.01); *H01L 23/49822* (2013.01); *H01L 23/49827* (2013.01); *H01L 23/49838* (2013.01); *H01L 23/53223* (2013.01); *H01L 23/53238* (2013.01); *H01L 23/562* (2013.01); *H01L 24/16* (2013.01); *H01L 24/29* (2013.01); *H01L 24/32* (2013.01); *H01L 24/45* (2013.01); *H01L 24/48* (2013.01); *H01L 24/73* (2013.01); *H01L 24/81* (2013.01); *H01L 24/85* (2013.01); *H01L 2221/68345* (2013.01); *H01L 2221/68381* (2013.01); *H01L 2224/05026* (2013.01); *H01L 2224/16225* (2013.01); *H01L 2224/2919* (2013.01); *H01L 2224/32225* (2013.01); *H01L 2224/45144* (2013.01); *H01L 2224/48091* (2013.01); *H01L 2224/48227* (2013.01); *H01L 2224/73265* (2013.01); *H01L 2224/8385* (2013.01); *H01L 2224/83439* (2013.01); *H01L 2224/83444* (2013.01); *H01L 2224/83447* (2013.01); *H01L 2224/85439* (2013.01); *H01L 2224/85444* (2013.01); *H01L 2224/85447* (2013.01); *H01L 2924/00014* (2013.01); *H01L 2924/01028* (2013.01); *H01L 2924/01029* (2013.01); *H01L 2924/01047* (2013.01); *H01L 2924/01079* (2013.01); *H01L 2924/15311* (2013.01); *H01L 2924/181* (2013.01)

(58) Field of Classification Search
CPC . H01L 2224/05023; H01L 2224/05027; H01L 2224/05568; H01L 2224/08147; H01L 2224/08167; H01L 2224/10147; H01L 2224/16167; H01L 2224/40158; H01L 2224/08148; H01L 2224/08168; H01L 2224/16148; H01L 2224/16168; H01L 2224/40159; H01L 23/3128; H01L 23/49579; H01L 23/49861; H01L 21/6835; H01L 24/06; H01L 24/14; H01L 24/91

See application file for complete search history.

(56) References Cited

U.S. PATENT DOCUMENTS

| | | |
|---|---|---|
| 8,716,873 B2 | 5/2014 | Wang |
| 9,136,142 B2 | 9/2015 | Wang |
| 9,312,214 B2 | 4/2016 | Chen |
| 9,418,928 B2 * | 8/2016 | Liang ................. H01L 24/16 |
| 9,589,920 B2 * | 3/2017 | Hurwitz ............. H01L 23/291 |
| 2003/0116843 A1 | 6/2003 | Ijima |
| 2007/0164457 A1 | 7/2007 | Yamaguchi |
| 2008/0079127 A1 | 4/2008 | Gerber |
| 2009/0283884 A1 | 11/2009 | Kang et al. |
| 2012/0048914 A1 | 3/2012 | Hayashi et al. |
| 2012/0098112 A1 | 4/2012 | Kang et al. |
| 2012/0312590 A1 | 12/2012 | Maeda |
| 2013/0008706 A1 | 1/2013 | Tseng |
| 2013/0009320 A1 * | 1/2013 | Yoo ................ H01L 23/49827 257/774 |
| 2013/0097856 A1 | 4/2013 | Kaneko |
| 2015/0318235 A1 | 11/2015 | Chen |
| 2015/0351228 A1 | 12/2015 | Park |
| 2015/0364408 A1 | 12/2015 | Hsu |
| 2015/0364435 A1 | 12/2015 | Hsu |
| 2015/0366064 A1 | 12/2015 | Hsu |
| 2015/371873 A1 | 12/2015 | Su |
| 2016/0066423 A1 | 3/2016 | Sakamoto |
| 2016/0079149 A1 | 3/2016 | Yoshida |
| 2016/0079151 A1 * | 3/2016 | Chiu ................... H05K 1/186 257/737 |
| 2016/0093546 A1 * | 3/2016 | Pai ................ H01L 23/49822 216/13 |
| 2016/0254233 A1 | 9/2016 | Hu |

FOREIGN PATENT DOCUMENTS

| | | |
|---|---|---|
| JP | 2003-309241 A | 10/2003 |
| KR | 10-0335658 | 5/2002 |
| KR | 10-2009-0119455 | 11/2009 |
| KR | 10-2012-0019414 | 3/2012 |

OTHER PUBLICATIONS

Office Action received from Korean Patent Office forwarded by agent responsible for Korean prosecution; in Korean, English translation not available; dated Aug. 2, 2016; 6 pages.

Notice of Allowance received from Korean Patent Office forwarded by agent responsible for Korean prosecution; in Korean, English translation not available; dated Nov. 30, 2016; 5 pages.

* cited by examiner

SEMICONDUCTOR PACKAGE HAVING ROUTABLE ENCAPSULATED CONDUCTIVE SUBSTRATE AND METHOD

CROSS-REFERENCE TO RELATED APPLICATIONS

This application is a divisional application of U.S. patent application Ser. No. 16/032,295 filed on Jul. 11, 2018 and issued as U.S. Pat. No. 10,685,897 on Jun. 16, 2020, which is a divisional application of U.S. patent application Ser. No. 15/173,379 filed on Jun. 3, 2016 and issued as U.S. Pat. No. 10,049,954 on Aug. 14, 2018, which claims priority to and the benefit of Korean Patent Application No. 10-2015-0126935 filed on Sep. 8, 2015 in the Korean Intellectual Property Office, and all the benefits accruing therefrom under 35 U.S.C. § 119, the contents of which in their entirety are herein incorporated by reference.

BACKGROUND

The present invention relates, in general, to electronics, and more particularly, to semiconductor packages, structures thereof, and methods of fabricating semiconductor packages.

In general, semiconductor packages are designed to protect integrated circuits, or chips, from physical damage and external stresses. Also, semiconductor packages may provide a thermal conductance path to efficiently remove heat generated in the semiconductor chip, and may further provide electrical connections to other components, such as printed circuit boards. Materials used for semiconductor packages typically include ceramics and/or plastics, and packaging technologies have progressed from ceramic flat packs and dual in-line packages to pin grid arrays and leadless chip carrier packages, among others. With a continuing demand for miniaturization and higher performance of packaged semiconductor devices, finer pitch conductive substrates are needed; particularly those supporting various external interconnect structures.

Accordingly, it is desirable to have a structure and a method of forming a packaged semiconductor device including a routable encapsulated conductive substrate structure, such as a routable micro lead frame structure, that supports the demand for miniaturization and higher performance electronic devices. It is also desirable to manufacture the routable encapsulated conductive substrate structure or portions thereof in advance of completing assembly of the packaged semiconductor device to reduce manufacturing cycle time. In addition, in would be beneficial for the structure and method to support multiple external interconnect structures. Additionally, it is desirable for the structure and method to be easily incorporated into manufacturing flows, and to be cost effective.

BRIEF DESCRIPTION OF THE DRAWINGS

The above and other features of the present description will become more apparent by describing in detail exemplary embodiments thereof with reference to the attached drawings in which.

Figure 1A:
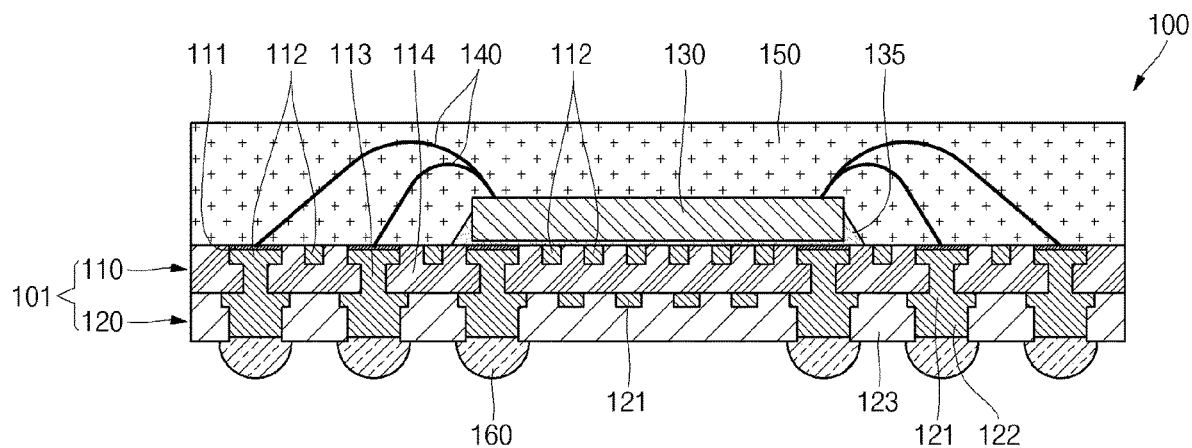
FIG. 1A is a cross-sectional view illustrating a packaged semiconductor device according to an embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention.

Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a packaged semiconductor device and a manufacturing method thereof that includes a routable encapsulated conductive substrate (for example, a routable molded lead frame) with a conductive surface finish layer. More particularly, the embodiments described herein facilitate efficient routing of a package level conductive pattern and provide enhanced connection reliability between the surface finish layer and a semiconductor die. The surface finish layer may be formed at an initial stage of a manufacturing process for one embodiment of a routable encapsulated conductive substrate. In another embodiment of a routable encapsulated conductive substrate, the surface finish layer may be formed at both initial and final stages of the manufacturing process.

In some embodiments, conductive balls are directly formed on, connected to, or adjoining bump pads without a surface finish layer when the surface finish layer is formed at the initial stage of a manufacturing process to provide a ball grid array package. In addition, when the surface finish layer is formed at each of the initial and final stages of a manufacturing process of a routable encapsulated conductive substrate, the surface finish layer formed at the final stage may be used as an input/output terminal to provide a land grid array package.

In some preferred embodiments, the materials used to form a first resin layer and a second resin layer of the routable molded leadframe and the material used to form a package body that encapsulates the semiconductor die are the same, or have similar thermal coefficients of expansion and other similar material properties, thereby efficiently suppressing warpage during the manufacturing process or the operation of the device.

More particularly, in one embodiment a semiconductor device comprises a first laminated layer, which includes a first surface finish layer, first conductive patterns comprising a first portion connected to the first surface finish layer and a second portion laterally spaced apart from the first surface finish layer, conductive vias connected to the first conductive pattern, and a first resin layer covering the first conductive patterns, the conductive vias, and a portion of the first surface finish layer, wherein the first surface finish layer is exposed in a first surface of the first resin layer and the conductive vias are exposed in a second surface of the first resin layer. A second laminated layer is disposed adjacent the first laminated layer and includes second conductive patterns connected to the conductive vias, conductive pads connected to the second conductive patterns, and a second resin layer covering at least a portion of the first resin layer, the second conductive patterns, and the conductive pads, wherein the conductive pads are exposed in a first surface of the second resin layer. A semiconductor die is electrically connected to the first surface finish layer and an encapsulant covers at least a portion of the first laminated layer and the semiconductor die.

In another embodiment, a packaged semiconductor device includes a routable encapsulated conductive substrate, which comprises a first conductive structure encapsulated within a first resin layer, a second conductive structure electrically connected to the first conductive structure and encapsulated within a second resin layer, and a first surface finish layer disposed on at least portions of the first conductive structure. The first surface finish layer is exposed in the first resin layer and at least portions of the second conductive structure are exposed in the second resin layer. A semiconductor die is electrically connected to the first surface finish layer and an encapsulant encapsulates the semiconductor die and the first surface finish layer.

In a further embodiment, a method of manufacturing a semiconductor device includes providing a routable encapsulated conductive substrate comprising a first conductive structure encapsulated within a first resin layer, a second conductive structure electrically connected to the first conductive structure and encapsulated within a second resin layer, and a first surface finish layer disposed on at least portions of the first conductive structure, wherein the first surface finish layer is exposed in the first resin layer and at least portions of the second conductive structure are exposed in the second resin layer. The method includes electrically connecting a semiconductor die to the first surface finish layer and forming an encapsulant covering the semiconductor die and the first surface finish layer.

Figure 1B:
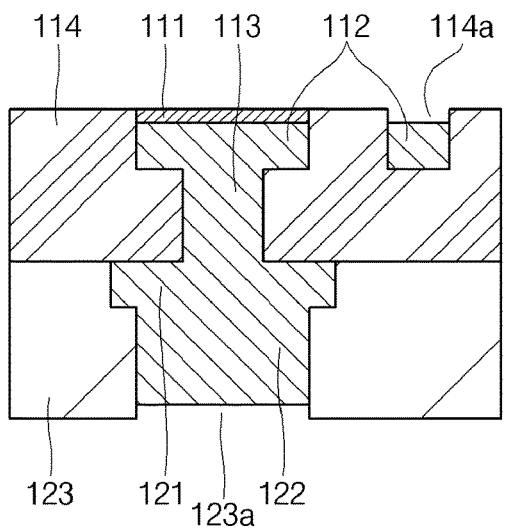
FIG. 1B is an enlarged cross-sectional view illustrating a region of FIG. 1A.

FIG. 1A is a cross-sectional view illustrating a semiconductor device 100 or packaged semiconductor device 100 having a surface finish layer in accordance with a first embodiment, and FIG. 1B is an enlarged cross-sectional view illustrating a region of FIG. 1A. As illustrated in FIG. 1A, the semiconductor device 100 includes a first laminated layer 110 or first encapsulated layer 110, a second laminated layer 120 or second encapsulated layer 120, a semiconductor die 130, conductive connective structures 140, such as conductive wires 140, an encapsulant 150 or package body 150, conductive bumps 122 or bump pads 122, and conductive bumps 160. In accordance with the present embodiment, the first laminated layer 110 and the second laminated layer 120 may be referred to as a routable molded lead frame 101 or a routable encapsulated conductive substrate 101.

In one embodiment, the first laminated layer 110 includes a first surface finish layer 111, a first bonding layer 111, or a first wire-bondable finish layer 111, first conductive patterns 112, vias 113, conductive vias 113, or conductive pillars 113, and a first resin layer 114. In some embodiments, the first surface finish layer 111 may be a metal material, such as nickel/gold (Ni/Au), silver (Ag), copper (Cu), combinations thereof, and equivalents thereof, but aspects of the present embodiment are not limited thereto. In one embodiment, the first conductive patterns 112 may be disposed on or adjoining the first surface finish layer 111, and/or may be disposed spaced apart from the first surface finish layer 111. The first conductive patterns 112 may be made of a metal, such as copper (Cu), and equivalents thereof, but aspects of the present embodiment are not limited thereto. In one embodiment, the vias 113 are formed on, connected to, or adjoining the first conductive patterns 112, and may have a smaller width and a larger thickness than the first conductive patterns 112. The vias 113 may also be made of a metal, such as copper (Cu) and equivalents thereof, but aspects of the present embodiment are not limited thereto. The first resin layer 114 may cover the first surface finish layer 111, the first conductive patterns 112 and the vias 113. However, top surfaces of the first surface finish layer 111 and the first conductive patterns 112 may not be covered by the first resin layer 114. Also, bottom surfaces of the vias 113 may not be covered by the first resin layer 114. The first resin layer 114 may be made of a polymer material, such as one or more of polyimide (PI), benzocyclobutene (BCB), polybenzoxazole (PBO), bismaleimidetriazine (BT), phenolic resin, epoxy molding compound, and equivalents thereof, but aspects of the present embodiment are not limited thereto. In some embodiments, vias 113 are connected to only first portions of the first conductive patterns 112 leaving second portions of the first conductive patterns 112 at least partially embedded within the first resin layer 114 as generally illustrated in FIG. 1A.

In one embodiment, the second laminated layer 120 includes second conductive patterns 121, bump pads 122 or conductive pads 122, and a second resin layer 123. In one embodiment, the second conductive patterns 121 may be disposed on or adjoining the vias 113, and may be positioned adjacent to a bottom surface of the first resin layer 114. In some embodiments, the second conductive patterns 121 may be disposed on or adjoining the bottom surface of the first resin layer 114. In addition, the second conductive patterns 121 may be a metal, such as copper (Cu) and equivalents thereof, but aspects of the present embodiment are not limited thereto. In one embodiment, the bump pads 122 may be formed on, connected to, or adjoining the second conductive patterns 121, and may have a smaller width and a larger thickness than the second conductive patterns 121. The bump pads 122 may also be a metal, such as copper (Cu) and equivalents thereof, but aspects of the present embodiment n are not limited thereto. The second resin layer 123 may cover at least portions of the first resin layer 114, the second conductive patterns 121 and the bump pads 122. However, a top surface of the second conductive patterns 121 may not be covered by the second resin layer 123. Also, bottom surfaces of the bump pads 122 may not be covered by the second resin layer 123 and may be exposed to the outside. The second resin layer 123 may be made of a polymer materials, such as one or more of polyimide (PI), benzocyclobutene (BCB), polybenzoxazole (PBO), bismaleimidetriazine (BT), phenolic resin, epoxy molding compound, and equivalents thereof, but aspects of the present embodiment are not limited thereto.

In accordance with the present embodiment, a stacked structure including the first laminated layer 110 and the second laminated layer 120 may be referred to as a routable encapsulated conductive substrate 101 or a routable molded lead frame 101, which can be handled as a single unit in the course of manufacturing the semiconductor device 100.

In one embodiment, the semiconductor die 130 is connected to the routable molded lead frame 101. In some embodiments, the semiconductor die 130 is attached to the first laminated layer 110 using, for example, an adhesive 135 and further electrically connected to the first laminated layer 110. In accordance with one embodiment, the semiconductor die 130 may be electrically connected to the first surface finish layer 111 using the conductive wires 140. In one embodiment, the conductive wires 140 comprise gold wires, and the first surface finish layer 111 comprises nickel/gold (Ni/Au) or silver (Ag). In this embodiment, the conductive wires 140 and the first surface finish layer 111 can be more easily connected to each other. In some embodiments, the semiconductor die 130 may include electrical circuits including, for example, digital signal processors (DSPs), network processors, power management units, audio processors, RF circuits, wireless baseband system on chip (SoC) processors, sensors, application specific integrated circuits (ASICs), and/or other active and/or passive electronic devices as known to those of skill in the art.

In one embodiment, the encapsulant 150 encapsulates, covers, or molds the routable molded lead frame 101 including, for example, the semiconductor die 130 and the conductive wires 140, and at least portions of the first laminated layer 110. In some embodiments, the encapsulant 150 may cover the first surface finish layer 111 and the first conductive patterns 112. The encapsulant 150 may be a polymer composite material, such as an epoxy mold compound for performing encapsulation through a molding process, a liquid encapsulating member for performing encapsulation through a dispenser, or an equivalent thereof, but aspects of the present embodiment are not limited thereto. In one preferred embodiment, when the first resin layer 114, the second resin layer 123 and the encapsulant 150 are formed using the same material, they may have the same coefficient of thermal expansion, thereby minimizing warpage during the manufacturing process or the operation of the semiconductor device 100.

In one embodiment, the conductive bumps 160 may be connected to the bump pads 122. In one embodiment, the conductive bumps 160 may be fused or attached to the bump pads 122, which are not covered by the second resin layer 123. The conductive bumps 160 may be pillars, pillars with solder caps, conductive balls, solder balls, and equivalents thereof, but aspects of the present embodiment are not limited thereto. In the illustrated embodiment, the conductive bumps 160 as shown as conductive balls as one example.

In accordance with the present embodiment, the semiconductor device 100 is configured as a wire bonded routable molded lead frame package that is further configured as a ball grid array type package.

In accordance with the present embodiment, lateral surfaces of the routable molded lead frame 101 including for example, the first laminated layer 110 and the second laminated layer 120, and the encapsulant 150 are configured to be coplanar with one another by singulating in the course of manufacturing the semiconductor device 100. In one embodiment, lateral surfaces of the first resin layer 114 of the first laminated layer 110, the second resin layer 123 of the second laminated layer 120, and the encapsulant 150 are substantially coplanar with one another. In one preferred embodiment, the first conductive patterns 112 of the first laminated layer 110 are not exposed to the outside through the lateral surface of the first resin layer 114, and the second conductive patterns 121 of the second laminated layer 120 are not exposed to the outside through the lateral surface of the second resin layer 123. Therefore, it is possible to prevent unnecessary electrical shorts between each of the first conductive patterns 112 and the second conductive patterns 121 and an external device. In addition, because the first surface finish layer 111 is formed on the first conductive patterns 112, the conductive wires 140 can be easily connected to the first surface finish layer 111.

As illustrated in FIG. 1B, in one embodiment a top surface of the first surface finish layer 111 is substantially coplanar with the top surface of the first resin layer 114. However, a top surface of each of the first conductive patterns 112 horizontally or laterally spaced apart from the first surface finish layer 111 may be lower than or recessed with respect to the top surface of the first resin layer 114. Moreover, a bottom surface of each of the bump pads 122 is higher than or recessed with respect to the bottom surface of the second resin layer 123. Stated another way, the top surface of each of the first conductive patterns 112 is recessed inside a first opening 114a formed in the first resin layer 114. Likewise, the bottom surface of each of the bump pads 122 is recessed inside a second opening 123a formed in the second resin layer 123.

Such configurational features may result from the manufacturing process in accordance with the present embodiment. For example, when removing steps, such as grinding and/or etching are performed on the first resin layer 114, the first surface finish layer 111 functions as a mask, and the top surface of each of the first conductive patterns 112 can be over-etched slightly more than the first resin layer 114 so that the top surface of each of the first conductive patterns 112 can positioned inside or recessed within the first opening 114a. In addition, when removing steps, such as grinding and/or etching are performed on the second resin layer 123, the bottom surface of each of the second conductive patterns 121 is over-etched with respect to the second resin layer 123, so that the bottom surface of each of the second conductive patterns 121 can be positioned inside or recessed within the second opening 123a.

Thus, in accordance with the present embodiment the first opening 114a formed in the first resin layer 114 improves a coupling force between the encapsulant 150 and the first resin layer 114, and the second opening 123a formed in the second resin layer 123 improves coupling forces between each of the conductive bumps 160, bump pads 122, and the second resin layer 123. In some embodiments, the vias 113 and portions of the first conductive patterns 112 and/or the second conductive patterns 121 and the bump pads 122 form a "T" like shape in cross-sectional view as generally illustrated in FIG. 1B. In some embodiments, the first conductive patterns 112 and the vias 113 are an example of a first conductive structure, and the second conductive patterns 121 and the bumps pads 122 are an example of a second conductive structure. Stated another way, the first conductive structure may comprise the first conductive patterns 112 and the vias 113, and the second conductive structure may comprise the second conductive patterns 121 and the bumps pads 122.

Figure 2A:
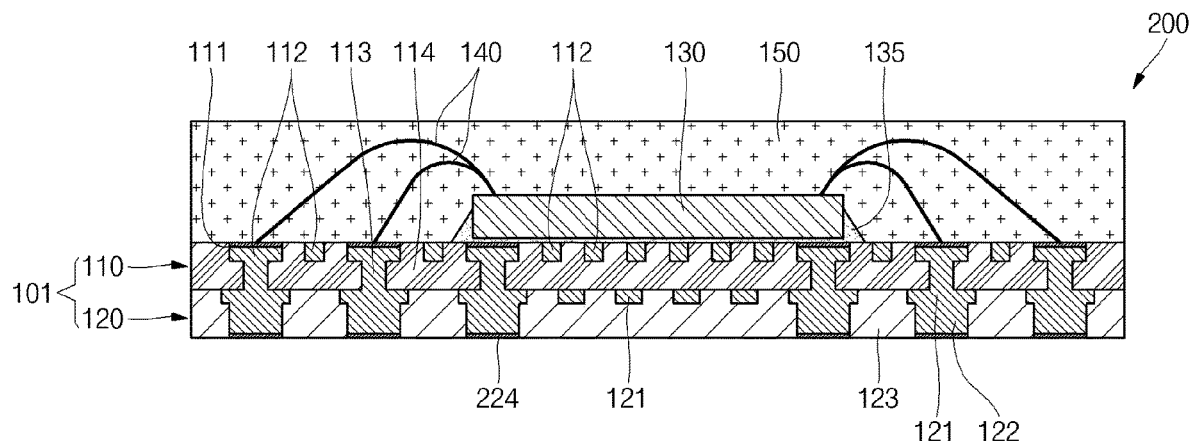
FIG. 2A is a cross-sectional view illustrating a packaged semiconductor device according to another embodiment of the present invention.
Figure 2B:
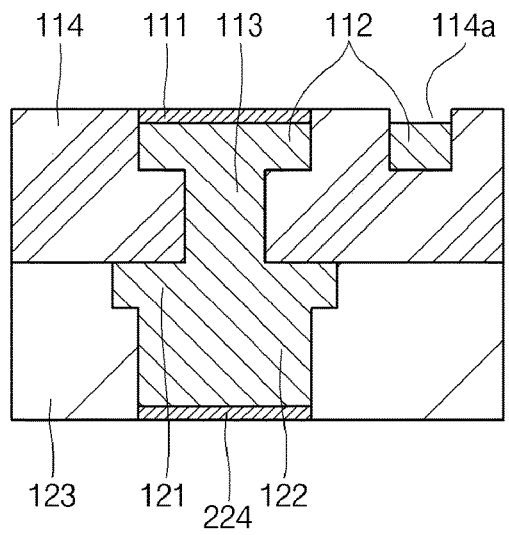
FIG. 2B is an enlarged cross-sectional view illustrating a region of FIG. 2A.
Figure 2C:
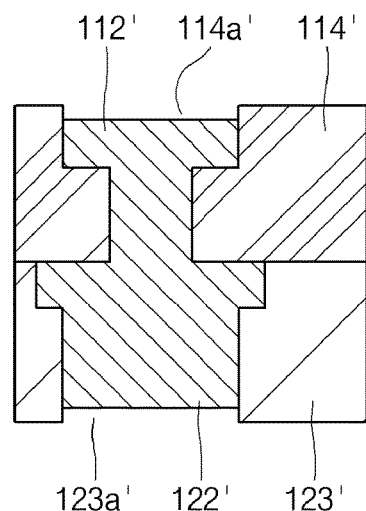
FIG. 2C is an enlarged cross-sectional view illustrating a region FIG. 2A in accordance with the an alternative embodiment.

FIG. 2A is a cross-sectional view illustrating a semiconductor device 200 or packaged semiconductor device 200 having a surface finish layer according to another embodiment; FIG. 2B is an enlarged cross-sectional view illustrating a region of FIG. 2A; and FIG. 2C is an enlarged cross-sectional view illustrating a region without a surface finish layer in accordance with an alternative embodiment.

As illustrated in FIG. 2A, instead of using conductive bumps, the routable molded lead frame 101 may alternatively include a second surface finish layer 224 or a second bonding layer 224 formed on or connected to the bump pads 122 of the second laminated layer 120. In some embodiments, the second surface finish layer 224 may comprise a metal material, such as nickel/gold (Ni/Au), silver (Ag), tin (Sn), combinations thereof, and equivalents thereof, but aspects of the present embodiment are not limited thereto. In accordance with the present embodiment, the semiconductor device 200 is configured as a wire bonded routable molded lead frame package that is further configured as a land grid array type package. In another embodiment, conductive bumps may be connected to the second surface finish layer 224.

As illustrated in FIG. 2B, in one embodiment a top surface of a first surface finish layer 111 is substantially coplanar with the top surface of a first resin layer 114, and a bottom surface of the second surface finish layer 224 is substantially coplanar with the bottom surface of the second resin layer 123. However, a top surface of each of first conductive patterns 112 horizontally or laterally spaced apart from the first surface finish layer 111 may be lower than or recessed with respect to the top surface of the first resin layer 114. Stated another way, the top surface of each of the first conductive patterns 112 is recessed inside a first opening 114a formed in the first resin layer 114.

Such configurational features may result from the manufacturing process in accordance with the present embodiment. For example, when removing steps, such as grinding and/or etching are performed on the first resin layer 114 and/or the second resin layer 123, the first surface finish layer 111 and/or the second resin layer 123 function as masks, and the top surface of each of the first conductive patterns 112 can be over-etched slightly more than the first resin layer 114, so that the top surface of each of the first conductive patterns 112 is positioned inside or recessed within the first opening 114a formed in the first resin layer 114.

As illustrated in FIG. 2C, when no first surface finish layer is formed on first conductive patterns 112' and no second surface finish layer is formed on bump pads 122', a top surface of each of the first conductive patterns 112' may be positioned lower than or recessed with respect to a top surface of a first resin layer 114' and a bottom surface of each of bump pads 122' may be positioned higher than or recessed with respect to a bottom surface of a second resin layer 123'. In one embodiment, when removal steps, such as grinding and/or etching are performed on the first resin layer 114' and/or the second resin layer 123' in the absence of masking layers, the top surface of each of the first conductive patterns 112' and/or the bottom surface of each of the bump pads 122' may be over-etched compared to the first resin layer 114' and/or the second resin layer 123'. Therefore, the first conductive pattern 112' is positioned inside or recessed within a first opening 114a' of the first resin layer 114', and the bottom surface of each of the bump pads 122' is positioned inside or recessed within a second opening 123a' of the second resin layer 123'.

Figure 3:
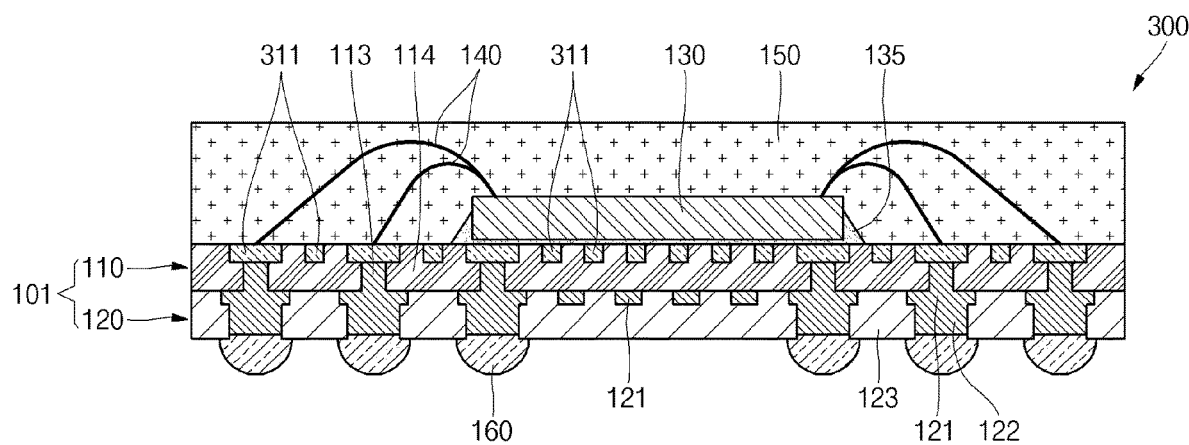
FIG. 3 is a cross-sectional view illustrating a packaged semiconductor device according to a further embodiment of the present invention.

FIG. 3 is a cross-sectional view illustrating a semiconductor device 300 or packaged semiconductor device 300 having a surface finish layer according to a further embodiment. As illustrated in FIG. 3, a first surface finish layer 311, first bonding layer 311, or first wire-bondable finish layer 311 comprises a metal material, such as silver (Ag), and vias 113 made of copper (Cu) may be formed on, connected to, or adjoining the first surface finish layer 311. In accordance with the present embodiment, in the semiconductor device 300 conductive wires 140 can be more easily bonded to the first surface finish layer 311 made of silver (Ag). In addition, the semiconductor device 300 according to the present embodiment is configured as a wire bonded routable molded lead frame package that is further configured as a ball grid array type package. Moreover, in accordance with the present embodiment, the first surface finish layer 311 can also be configured as the first conductive patterns for semiconductor device 300. In some embodiments, the vias 113 are an example of a first conductive structure, and the second conductive patterns 121 and the bumps pads 122 are an example of a second conductive structure.

Figure 4:
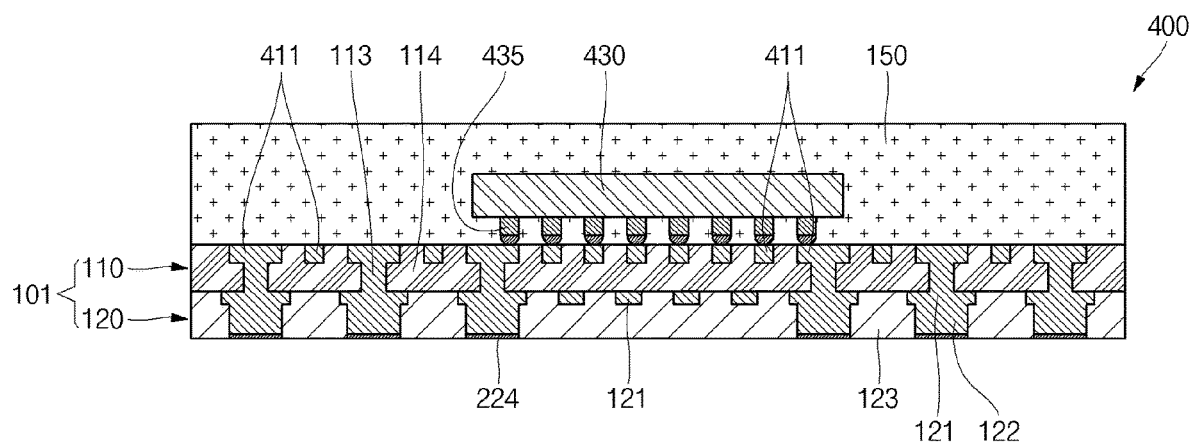
FIG. 4 is a cross-sectional view illustrating a packaged semiconductor device according to a still further embodiment of the present invention.

FIG. 4 is a cross-sectional view illustrating a semiconductor device 400 or packaged semiconductor device 400 having a surface finish layer according to a still further embodiment. As illustrated in FIG. 4, a first surface finish layer 411, first bonding layer 411, or first wire-bondable finish layer 411 may comprise a metal material, such as copper (Cu), and vias 113 made of copper (Cu) may be formed on, connected to, or adjoining the first surface finish layer 411. In accordance with the present embodiment, because the semiconductor die 130 is not directly connected to the first surface finish layer 411 by wire bonding, it may be connected to the first surface finish layer 411 through other types of conductive connective structures, such as micro bumps 435. In one embodiment, the semiconductor die 130 is electrically connected to the first surface finish layer 411 in a flip-chip type configuration. In addition, the encapsulant 150 is interposed between the semiconductor die 130 and the first laminated layer 110, thereby allowing the semiconductor die 130 and the first laminated layer 110 to be mechanically integrated with each other. Additionally, instead of conductive bumps, a second surface finish layer 224 or second bonding layer 224 made of metal material, such as nickel/gold (Ni/Au), silver (Ag) or tin (Sn), may be formed on bump pads 122. In accordance with the present embodiment, the semiconductor device 400 is configured as a flip-chip routable molded lead frame package that is further configured as a land grid array type package. In accordance with the present embodiment, the first surface finish layer 411 can also be configured as the first conductive patterns for semiconductor device 400. In an alternative embodiment, conductive bumps may be formed on the second surface finish layer 224. In some embodiments, the vias 113 are an example of a first conductive structure, and the second conductive patterns 121 and the bumps pads 122 are an example of a second conductive structure. It is understood that attachment configuration for semiconductor die 130 in FIG. 4 may be used in any of the embodiments described herein.

Figure 5A:
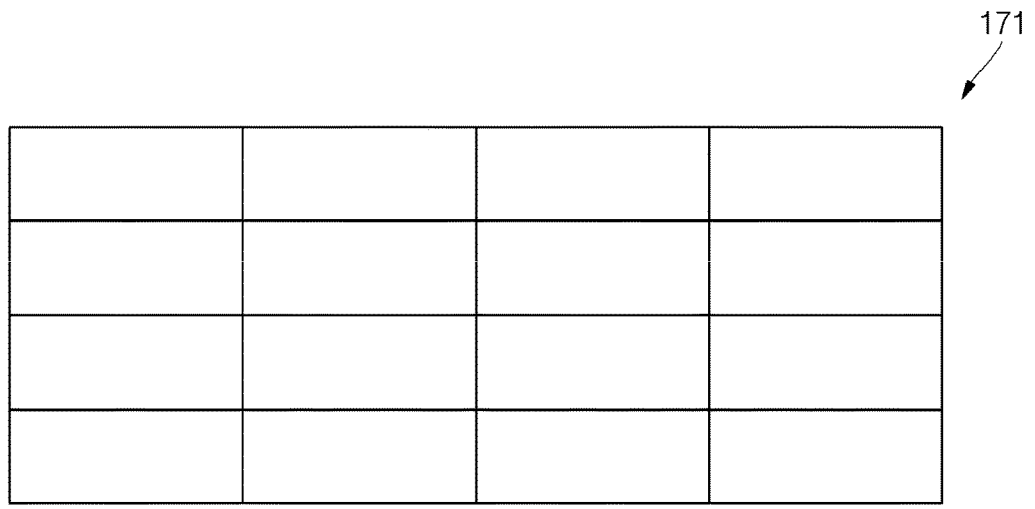
FIG. 5A is a plan view illustrating a carrier consisting of (N×M) units.
Figure 5B:
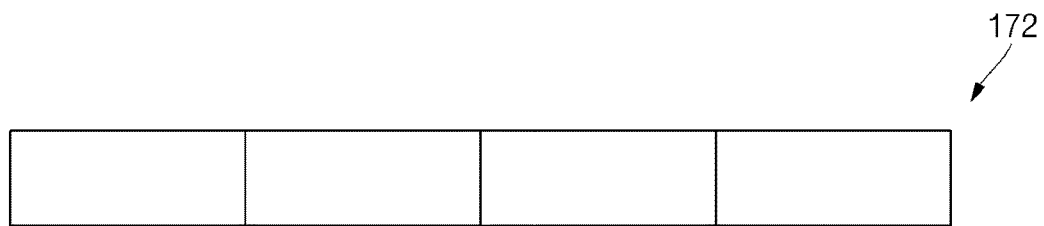
FIG. 5B is a plan view illustrating a carrier consisting of N units.

FIG. 5A is a plan view illustrating a carrier 171 consisting of an N×M matrix or array of packaged units, and FIG. 5B is a plan view illustrating a carrier 172 consisting of 1×M units. As illustrated in FIG. 5A, a carrier 171, on which, for example, the semiconductor devices 100 to 400 are manufactured, is formed in a matrix consisting of N×M units. In one embodiment, N and M preferably can be integers greater than or equal to 2. As described above, since the carrier 171 is formed in a matrix type, the semiconductor devices 100 to 400 according to the embodiments of the present invention can be manufactured in large batch quantities. As illustrated in FIG. 5B, a carrier 172 may be formed as strips of 1×M units. In one embodiment, M preferably can be an integer greater than 1.

FIGS. 6A to 6J are cross-sectional views sequentially illustrating an embodiment of a manufacturing method for semiconductor device 100 or packaged semiconductor device 100 having a surface finish layer 111. As illustrated in FIGS. 6A to 6J, the manufacturing method for semiconductor device 100 includes the steps of providing a carrier 170 and forming a first surface finish layer 111, forming first conductive patterns 112, forming vias 113, providing a first resin layer 114, first removing (e.g., grinding) a portion of the first resin layer 114, forming second conductive patterns 121, forming bump pads 122, providing a second resin layer 123, removing the carrier 170, connecting a semiconductor die 130, forming an encapsulant 150, and forming conductive bumps 160.

Figure 6A:
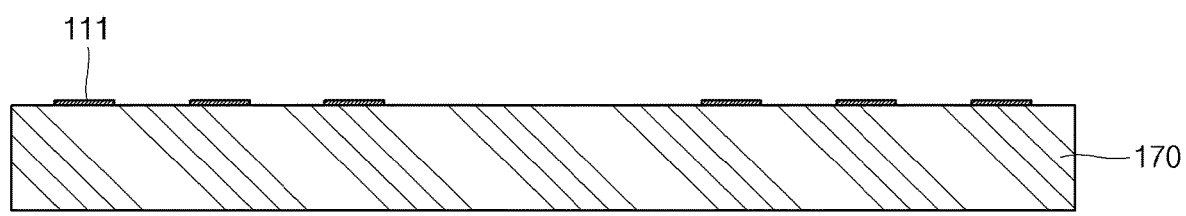
FIGS. 6A to 6J are cross-sectional views sequentially illustrating a manufacturing method of a packaged semiconductor device according to an embodiment of the present invention.

As illustrated in FIG. 6A, in the step of providing the carrier 170 and forming the first surface finish layer 111, a carrier 170 having, for example, a substantially flat plate-like shape is prepared, and a plurality of first surface finish layers 111 are formed on or adjacent to a major surface of the carrier 170. In one embodiment, the carrier 170 may be made of a conductive material, such as copper (Cu), an insulating material, such as polyimide, and/or a ceramic material, such as alumina, or other materials as known to those of skill in the art. In some embodiments where the carrier 170 is made of a conductive material, the first surface finish layer 111 may be formed on, connected to, or adjoining a surface of the carrier 170. In other embodiments where the carrier 170 is made of an insulating material or a ceramic material, a conductive seed layer (made of, for example, tungsten or tungsten titanium) may be formed first, and the first surface finish layer 111 may then be formed on, connected to, or adjoining the conductive seed layer. In addition, the first surface finish layer 111 may be formed by physical vapor deposition (PVD), chemical vapor deposition (CVD), metal sputtering, metal evaporation, electrolytic or electroless plating or other formation techniques as known to those of skill in the art. In accordance with the present embodiment, first surface finish layer 111 comprises a material that more easily bonds to or forms bonds with conductive connective structures, such as connective wires or bumps. In addition, the first surface finish layer 111 preferably comprises a material that has etch selectively with respect to the first conductive patterns 112. In some embodiments, the first surface finish layer 111 may be made of nickel/gold (Ni/Au) or silver (Ag), but aspects of the present embodiment are not limited thereto. In one embodiment, the first surface finish layer 111 has a thickness in a range from approximately 0.1 microns through 15 microns.

Figure 6B:
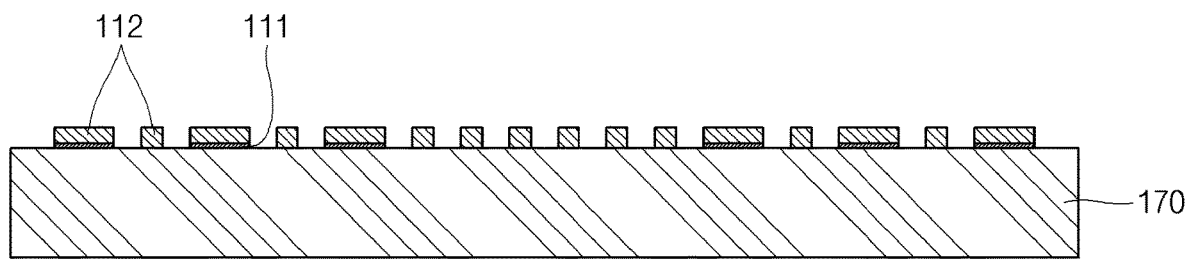

As illustrated in FIG. 6B, in the step of forming the first conductive patterns 112, the first conductive patterns 112 are formed on, connected to, or adjoining surfaces of the first surface finish layer 111 and the carrier 170. More particularly, first conductive patterns are configured as routed first conductive patterns 112, and may be formed on surfaces of the first surface finish layer 111 and the carrier 170. The first conductive patterns 112 may be formed by PVD, CVD, metal sputtering, metal evaporation, electrolytic or electroless plating or other formation techniques as known to those of skill in the art. In addition, the first conductive patterns 112 may be made of a conductive material, such as copper (Cu). In one embodiment, the first conductive patterns 112 have a thickness in a range from approximately 3 microns through 30 microns.

Figure 6C:
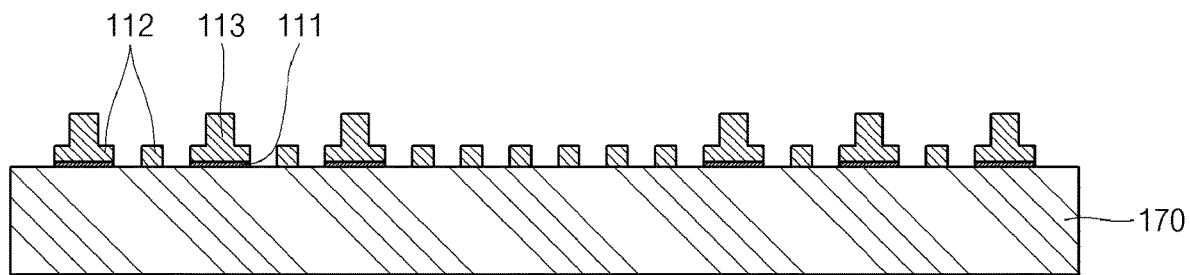

As illustrated in FIG. 6C, in the step of forming the vias 113, conductive vias 113, or conductive pillars 113, the vias 113 shaped of relatively thick pillars are formed on, connected to, or adjoining the first conductive patterns 112. The vias 113 may be formed by electroless plating and/or electroplating and may be made of copper (Cu). In one embodiment, the vias 113 have a thickness in a range from approximately 20 microns through 100 microns.

Figure 6D:
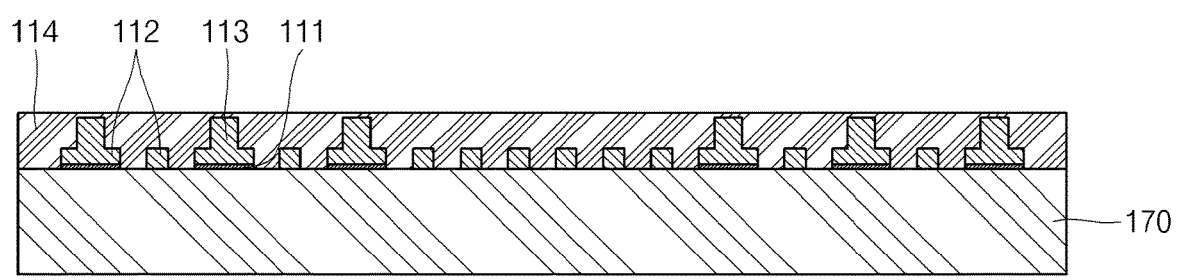

As illustrated in FIG. 6D, in the step of forming the first resin layer 114, the first resin layer 114 is formed or coated onto the carrier 170, thereby allowing the first resin layer 114 to cover the carrier 170, the first surface finish layer 111, the first conductive patterns 112 and the vias 113. In some embodiments, the first resin layer 114 may be formed on the carrier 170 by, for example, spin coating, spray coating or deep coating, followed by UV and/or heat curing. The first resin layer 114 may be made of a polymer material, such as one or more of polyimide (PI), benzocyclobutene (BCB), polybenzoxazole (PBO), bismaleimidetriazine (BT), phenolic resin, epoxy molding compound, and equivalents thereof, but aspects of the present embodiment are not limited thereto. In one embodiment, the first resin layer 114 may be made of a general epoxy molding compound similar to the encapsulant 150. In such an embodiment, the first resin layer 114 may be formed by compression molding or transfer molding.

Figure 6E:
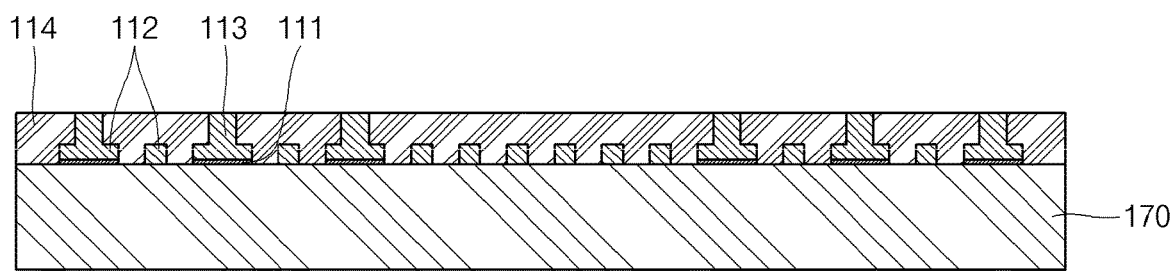

As illustrated in FIG. 6E, in the step of first removing, the first resin layer 114 is partially removed using, for example a grinding and/or an etching process until the vias 113 are exposed to the outside of the first resin layer 114. In such a manner, top surfaces of the vias 113 become substantially coplanar with a top surface of the first resin layer 114.

In accordance with the present embodiment, the first surface finish layer 111, the first conductive patterns 112, the vias 113 and the first resin layer 114 may be collectively defined as a first laminated layer 110.

Figure 6F:
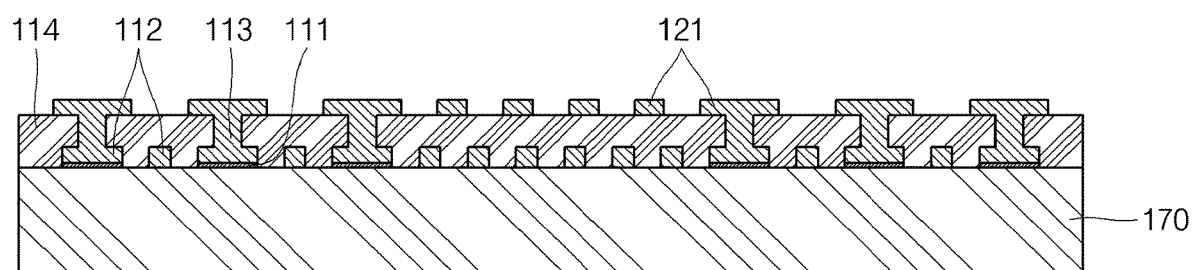

As illustrated in FIG. 6F, in the step of forming the second conductive patterns 121, the second conductive patterns 121 are formed on, adjoining, or connected to the vias 113 exposed to the outside through the first resin layer 114. In one embodiment, the second conductive patterns 121 are routed on the second resin layer 123 while being electrically connected to the vias 113. The second surface conductive patterns 121 may be formed by PVD, CVD, metal sputtering, metal evaporation, electrolytic or electroless plating or other formation techniques as known to those of skill in the art. In addition, the second conductive patterns 121 may be made of a conductive material, such as copper (Cu). In one embodiment, the second conductive patterns 121 have a thickness in a range from approximately 3 microns through 15 microns.

Figure 6G:
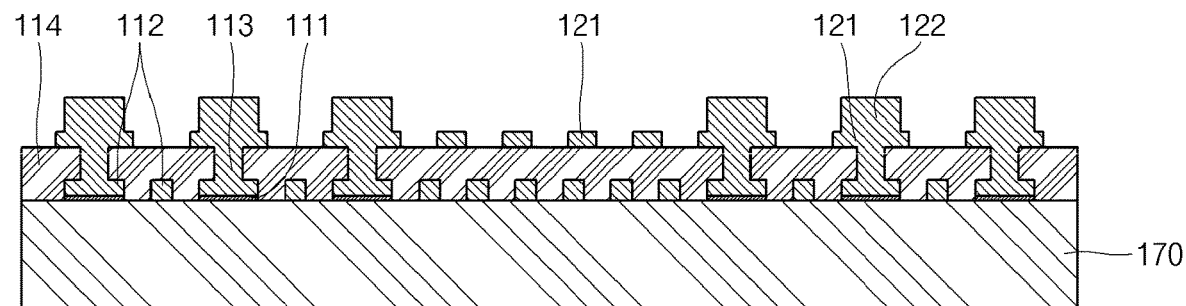

As illustrated in FIG. 6G, in the step of forming the bump pads 122, the bump pads 122 are formed on, connected to, or adjoining or connected to the second conductive patterns 121. The bump pads 122 may be formed by PVD, CVD, metal sputtering, metal evaporation, electrolytic or electroless plating or other formation techniques as known to those of skill in the art. In addition, the bump pads 122 may be made of a conductive material, such as copper (Cu). In one embodiment, the bump pads 122 have a thickness in a range from approximately 20 microns through 100 microns.

Figure 6H:
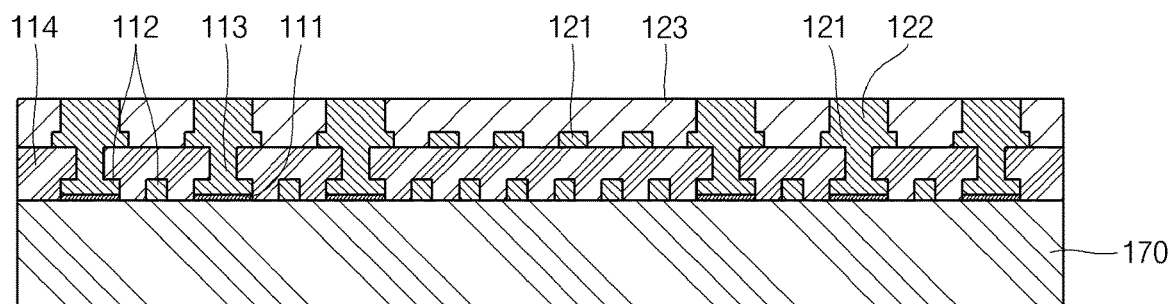

As illustrated in FIG. 6H, in the step of forming the second resin layer 123, the second resin layer 123 is formed or coated onto the first laminated layer 110, thereby allowing the second resin layer 123 to cover the first resin layer 114, the second conductive patterns 121 and the bump pads 122. In some embodiments, the second resin layer 123 may be coated in the same method and using the same material with the first resin layer 114. In addition, after the coating and curing of the second resin layer 123, a second removing step may further be performed. In the second removing step, the second resin layer 123 is partially removing using, for example, grinding and/or etching processes until the bump pads 122 are exposed to the outside of the second resin layer 123. In such a manner, top surfaces of the bump pads 122 become substantially coplanar with a top surface of the second resin layer 123. In one embodiment, if no masking layer is formed on the bump pads 122, surfaces of the bump pads 122 are positioned or recessed inside a second opening of the second resin layer 123 after an etching process as illustrated in FIG. 1B.

In accordance with the present embodiment, the second conductive patterns 121, the bump pads 122 and the second resin layer 123 may be collectively defined as a second laminated layer 120. In addition, the first laminated layer 110 and the second laminated layer 120 may be collectively defined as a routable molded lead frame 101.

Figure 6I:
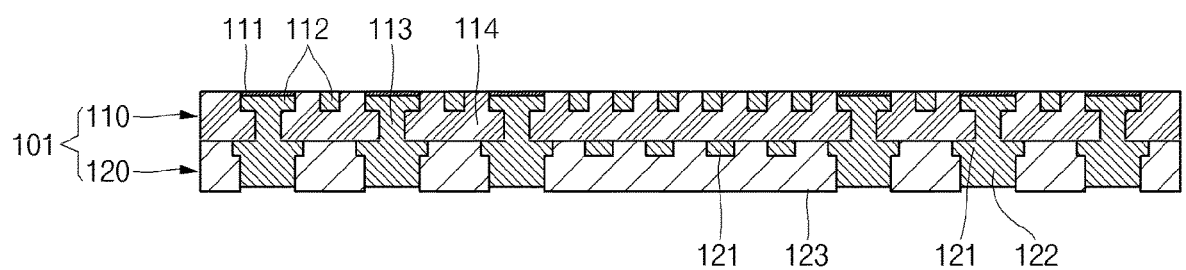

As illustrated in FIG. 6I, in the step of removing the carrier 170, the carrier 170 is removed from the first laminated layer 110. More particularly, the carrier 170 is removed from the first surface finish layer 111, the first conductive patterns 112 and the first resin layer 114, thereby allowing the first surface finish layer 111, the first conductive patterns 112 and the first resin layer 114 to be exposed to the outside. In one embodiment, the carrier 170 can be removed using grinding and/or etching processes. In one embodiment, the surfaces of the first conductive patterns 112 without the first surface finish layer 111 can be over-etched to be positioned inside or recessed within a first opening of the first resin layer 114 as illustrated in FIG. 1B.

Figure 6J:
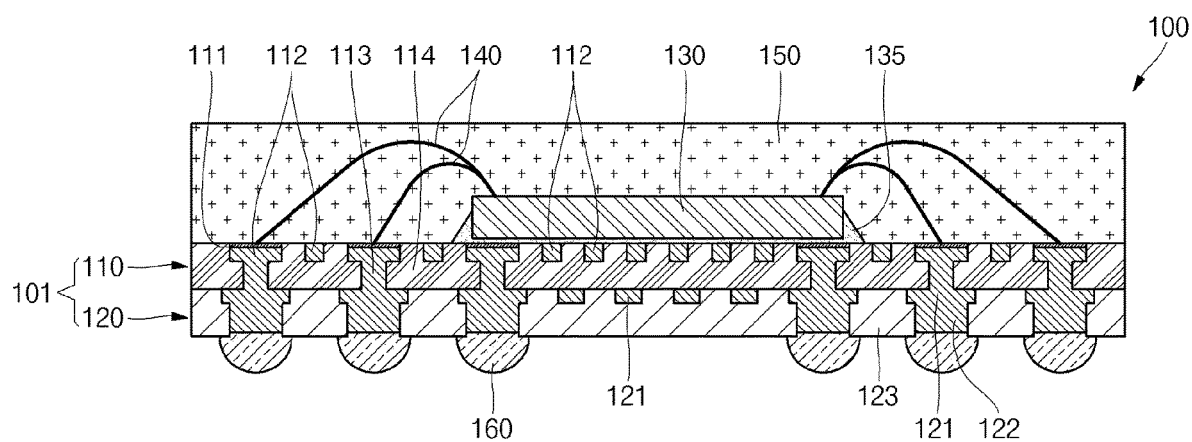

As illustrated in FIG. 6J, in the steps of connecting of the semiconductor die 130, forming the encapsulant 150, and forming the conductive bumps 160, the semiconductor die 130 can be attached to the first laminated layer 110 using, for example, an adhesive 135. Also, the semiconductor die 130 may be electrically connected to the first surface finish layer 111 using conductive connective structures, such as conductive wires 140. Next, the semiconductor die 130 and the conductive wires 140 are encapsulated using the encapsulant 150. The encapsulant 150 may be a polymer composite material, such as an epoxy mold compound for performing encapsulation through a molding process, a liquid encapsulating member for performing encapsulation through a dispenser, or an equivalent thereof, but aspects of the present embodiment are not limited thereto. In one embodiment, the conductive bumps 160 are formed on or connected to the bump pads 122 exposed to the outside through the second laminated layer 120. The conductive bumps 160 may be selected from the group consisting of pillars, pillars with solder caps, conductive balls, solder balls, and equivalents thereof, but aspects of the present embodiment are not limited thereto. In the illustrated embodiment of FIG. 6J, the conductive bumps 160 are shown as conductive balls as an example embodiment.

In addition, as described above, since the process of the present embodiment may be performed in the form of an N×M matrix or 1×M strips, a singulation process, such as a saw process may then be performed to produce individual semiconductor devices 100.

In accordance with the present embodiment, a manufacturing method is provided for manufacturing the semiconductor device 100, in which the first surface finish layer 111 is first formed and the rest of the structures and components can be formed later. In particular, the present embodiment provides a wire bonded routable molded lead frame ball grid array type package.

Figure 7A:
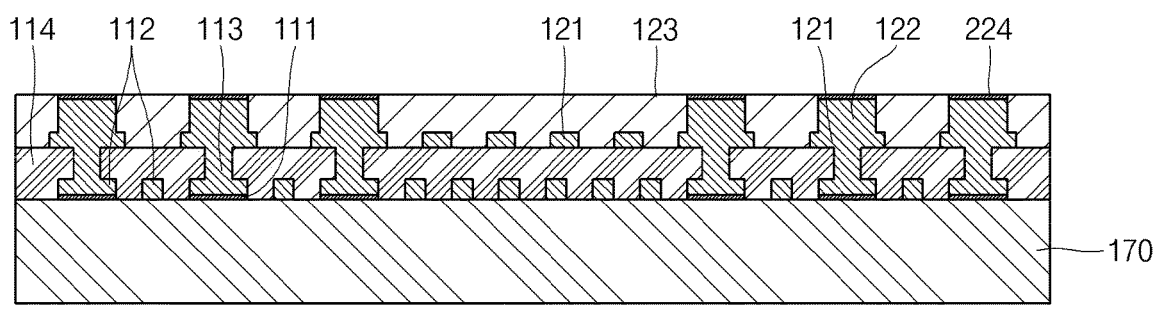
FIGS. 7A to 7C are cross-sectional views sequentially illustrating a manufacturing method of a packaged semiconductor device according to another embodiment of the present invention.
Figure 7B:
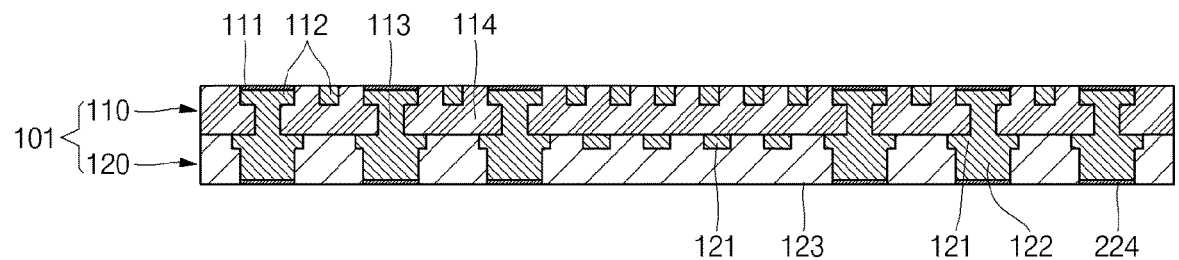
Figure 7C:
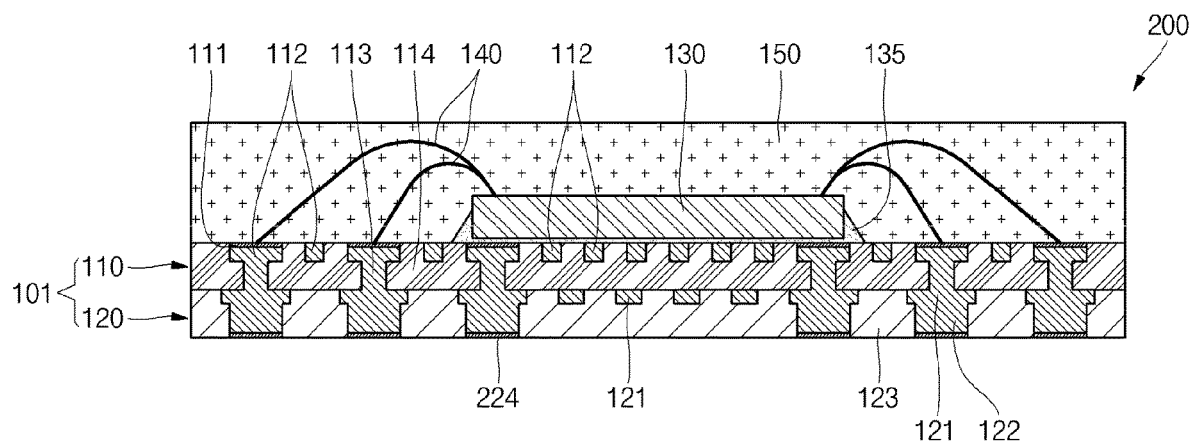

FIGS. 7A to 7C are cross-sectional views sequentially illustrating an embodiment of a manufacturing method for semiconductor device 200 or packages semiconductor device 200 having another surface finish layer 224. In the present embodiment, the manufacturing steps illustrated in conjunction with FIGS. 6A to 6H may be used, and the details thereof will not be repeated again here.

As illustrated in FIG. 7A, after the steps of forming (e.g., coating and curing) the second resin layer 123 and partially removing (e.g., grinding and/or etching) the second resin layer 123, the second surface finish layer 224 may further be formed on, connected to, or adjoining bump pads 122 exposed to the outside through the second resin layer 123. In one embodiment, the second surface finish layer 224 may be formed by PVD, CVD, metal sputtering, metal evaporation, electrolytic or electroless plating or other formation techniques as known to those of skill in the art. In accordance with the present embodiment, second surface finish layer 224 comprises a material that more easily bonds to or forms bonds with conductive structures disposed on next levels of assembly, such as printed circuit boards. In some embodiments, second surface finish layer 224 may be made of nickel/gold (Ni/Au), silver (Ag), tin (Sn), and equivalents thereof, but aspects of the present embodiment are not limited thereto.

As illustrated in FIG. 7B, as a result of removing the carrier 170, a routable molded lead frame 101 is provided, the routable molded lead frame 101 having a first surface finish layer 111 and first conductive patterns 112, which are exposed to the outside through the first laminated layer 110, and the second surface finish layer 224, which is exposed to the outside through the second laminated layer 120. In accordance with the present embodiment, the first surface finish layer 111 is formed at an initial stage of the manufacturing process of the routable molded lead frame 101, and the second surface finish layer 224 is formed at a final stage of the manufacturing process of the routable molded lead frame 101.

As illustrated in FIG. 7C, the semiconductor die 130 is attached to the routable molded lead frame 101 using, for example, an adhesive 135, and the semiconductor die 130 is electrically connected to the first surface finish layer 111 by conductive connective structures, such as conductive wires 140. In addition, the semiconductor die 130 and the conductive wires 140 may be encapsulated or molded using the encapsulant 150 as described previously.

In accordance with the present embodiment, conductive bumps may not be included on the bump pads 122, and the previously formed second surface finish layer 224 is exposed to the outside. Thus, the present embodiment provides a wire bonded routable molded lead frame land grid array package. In an alternative embodiment, conductive bumps may also be formed on the second surface finish layer 224.

FIGS. 8A to 8I are cross-sectional views sequentially illustrating a manufacturing method for semiconductor device 300 or packages semiconductor device 300 having a surface finish layer 311 according to a further embodiment. As illustrated in FIGS. 8A to 8I, the manufacturing method for semiconductor device 300 may include the steps of providing a carrier 170 and forming a first surface finish layer 311, forming vias 113, providing a first resin layer 114, first removing (e.g., grinding), forming conductive patterns 121, forming bump pads 122, providing a second resin layer 123, removing the carrier 170, connecting a semiconductor die 130, forming an encapsulant 150, and forming conductive bumps 160.

Figure 8A:
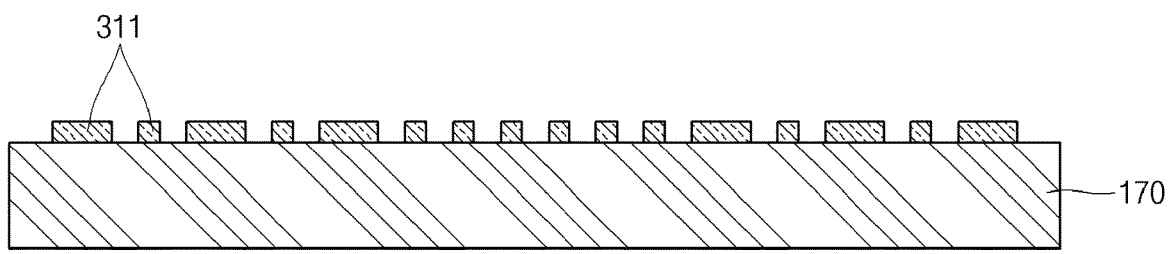
FIGS. 8A to 8I are cross-sectional views sequentially illustrating a manufacturing method of a packaged semiconductor device according to a further embodiment of the present invention.

As illustrated in FIG. 8A, in the steps of providing the carrier 170 and forming the first surface finish layer 111, the carrier 170 as described previously is prepared, and a f first surface finish layer 311 is formed on the carrier 170. In one embodiment, the first surface finish layer 311 may substantially function as first conductive patterns. In accordance with the present embodiment, first surface finish layer 311 comprises a material that more easily bonds to or forms bonds with conductive connective structures, such as connective wires or bumps. In some embodiments, the first surface finish layer 311 may be made of silver (Ag). In addition, the first surface finish layer 311 may be formed by PVD, CVD, metal sputtering, metal evaporation, electrolytic or electroless plating or other formation techniques as known to those of skill in the art. In one embodiment, the first surface finish layer 311 has a thickness in a range from approximately 3 microns through 15000 microns.

Figure 8B:
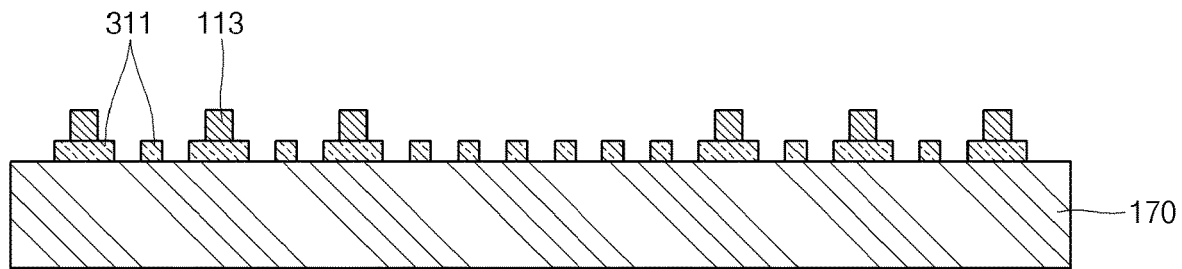

As illustrated in FIG. 8B, in the step of forming the vias 113, the vias 113 shaped of relatively thick pillars are formed on, connected to, or adjoining the first surface finish layer 311. The vias 113 may be made of copper (Cu) and formed as described previously.

Figure 8C:
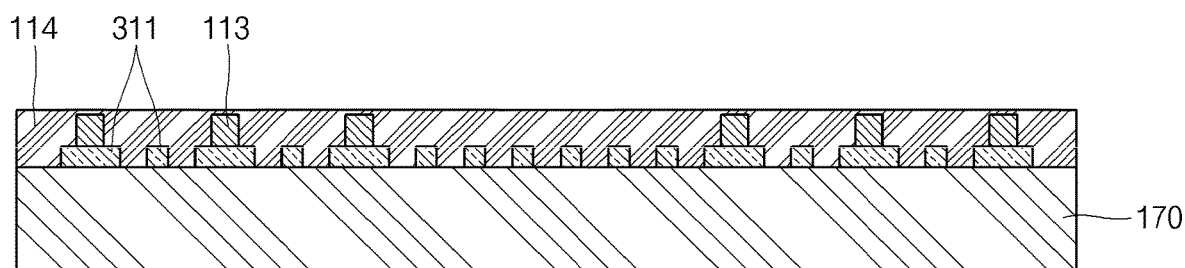

As illustrated in FIG. 8C, in the step of providing the first resin layer 114, the first resin layer 114 is formed or coated onto the carrier on 170 as described previously, thereby allowing the first resin layer 114 to cover the carrier 170, the first surface finish layer 311 and the vias 113.

Figure 8D:
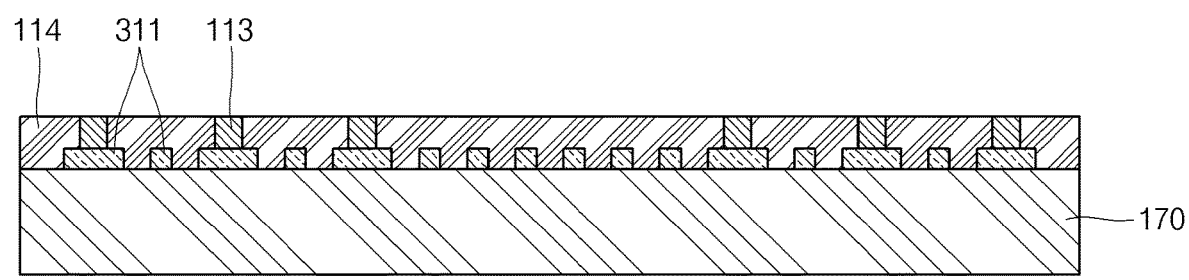

As illustrated in FIG. 8D, in the step of first removing, the first resin layer 114 is partially removing using, for example, grinding and/or etching processes until the vias 113 are exposed to the outside of the first resin layer 114. In accordance with the present embodiment, the first surface finish layer 311, the vias 113 and the first resin layer 114 may be collectively defined as a first laminated layer 110.

Figure 8E:
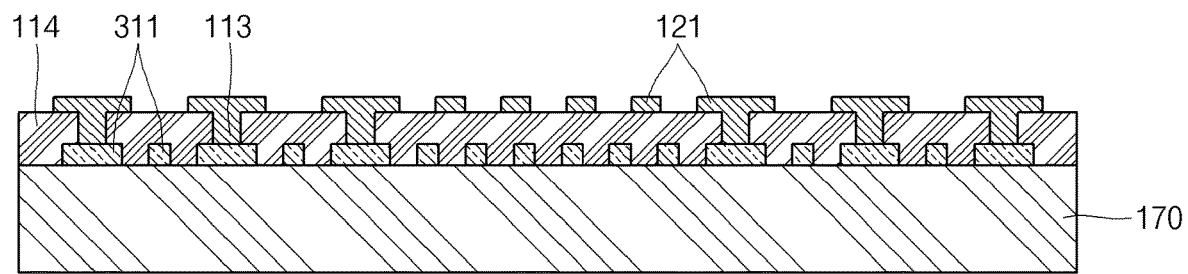

As illustrated in FIG. 8E, in the step of forming the second conductive patterns 121, the second conductive patterns 121 are formed on, connected to, or adjoining the vias 113 exposed to the outside through the first resin layer 114. In accordance with the present embodiment, the second conductive patterns 121 are routed on the second resin layer 123 while being electrically connected to the vias 113. The second conductive patterns 121 may be formed as previously described and may be made of copper (Cu) or other materials as known to those of skill in the art.

Figure 8F:
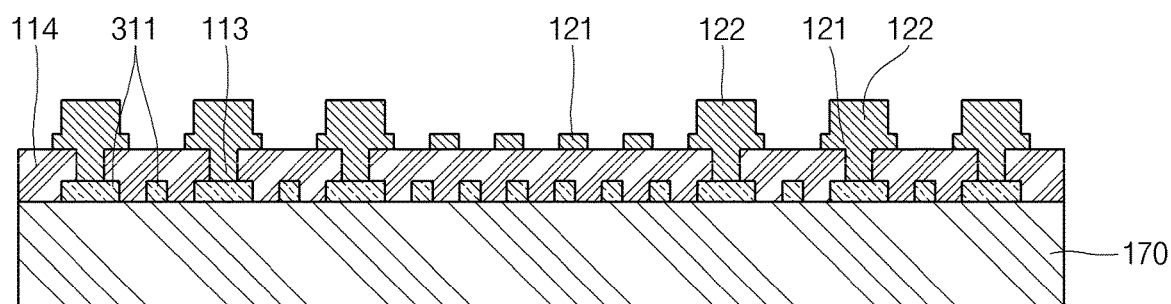

As illustrated in FIG. 8F, in the step of forming the bump pads 122, the bump pads 122 are formed on or connected to the second conductive patterns 121. The bump pads 122 may be formed as previously described and may be made of copper (Cu) or other materials as known to those of skill in the art.

Figure 8G:
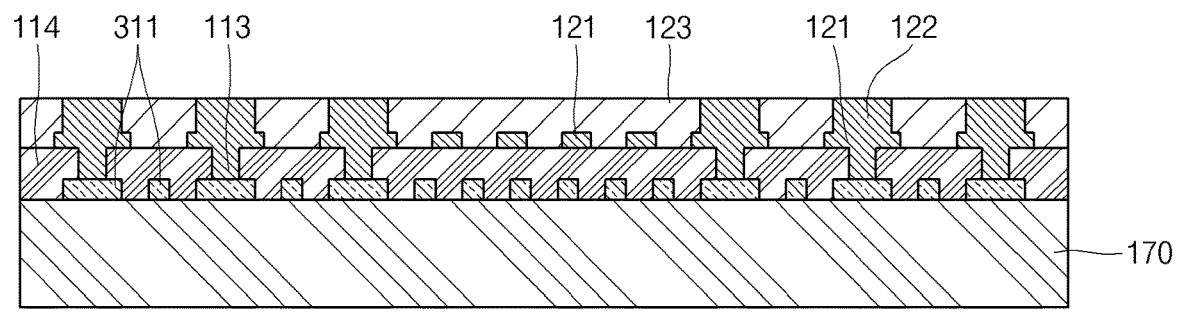

As illustrated in FIG. 8G, in the step of providing the second resin layer 123, the second resin layer 123 is formed or coated onto the first laminated layer 110, thereby disposing the second resin layer 123 to cover the first resin layer 114, the second conductive patterns 121 and the bump pads 122. In addition, after the coating and curing of the second resin layer 123, a second removing step may further be performed. In the second removing step, the second resin layer 123 is partially removed using, for example, grinding and/or etching processes until the bump pads 122 are exposed to the outside of the second resin layer 123. In one embodiment, if no masking layer is formed on the bump pads 122, surfaces of the bump pads 122 may be positioned inside or recessed within a second opening of the second resin layer 123 after an etching step.

In accordance with the present embodiment, the second conductive patterns 121, the bump pads 122 and the second resin layer 123 may be collectively defined as a second laminated layer 120.

Figure 8H:
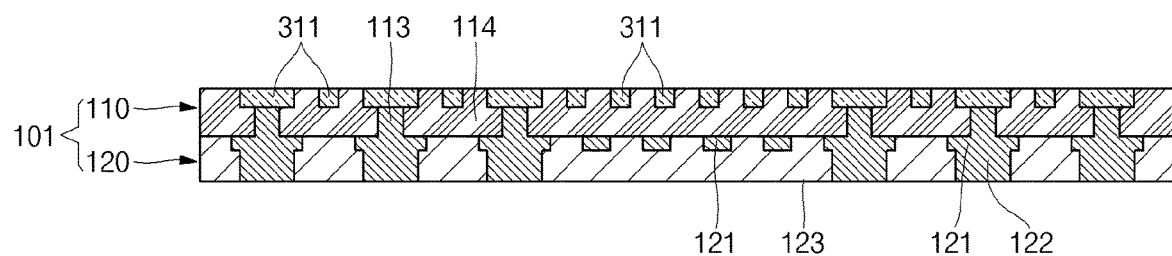

As illustrated in FIG. 8H, in the step of removing the carrier 170, the carrier 170 is removed from the first laminated layer 110. More particularly, the carrier 170 is removed from the first surface finish layer 311 and the first resin layer 114, thereby allowing the first surface finish layer 311 and the first resin layer 114 to be exposed to the outside. In one embodiment, the carrier 170 can be removed using grinding and/or etching processes. In accordance with the present embodiment, the first surface finish layer 311 including silver (Ag) functions as a mask, the surface of the first surface finish layer 311 becomes substantially coplanar with a surface of the first resin layer 114.

Figure 8I:
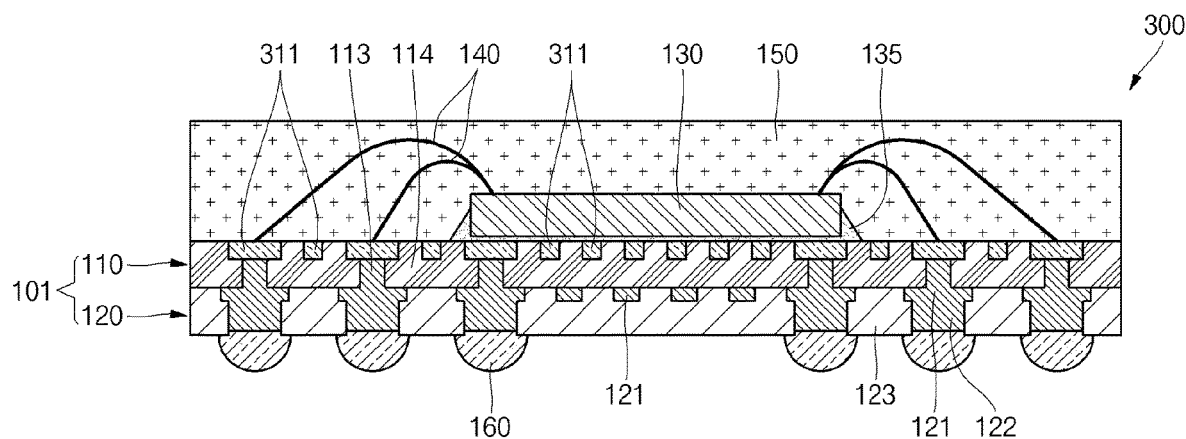

As illustrated in FIG. 8I, in the steps of connecting of the semiconductor die 130, forming the encapsulant 150, and forming of the conductive bumps 160, the semiconductor die 130 can be attached to the first laminated layer 110 using, for example, an adhesive 135. Also, the semiconductor die 130 is electrically connected to the first surface finish layer 311 using conductive connective structures, such as conductive wires 140. Next, the semiconductor die 130 and the conductive wires 140 are encapsulated using an encapsulant 150 as described previously. In one embodiment, the conductive bumps 160 are formed on or connected to the bump pads 122 exposed to the outside through the second laminated layer 120.

As described above, the present embodiment provides a manufacturing method of the semiconductor device 300, in which the first surface finish layer 311, which may comprise silver (Ag) is first formed and the rest of the structures and components can be formed later. In addition, the present embodiment provides a wire bonded routable molded lead frame ball grid array package.

Figure 9A:
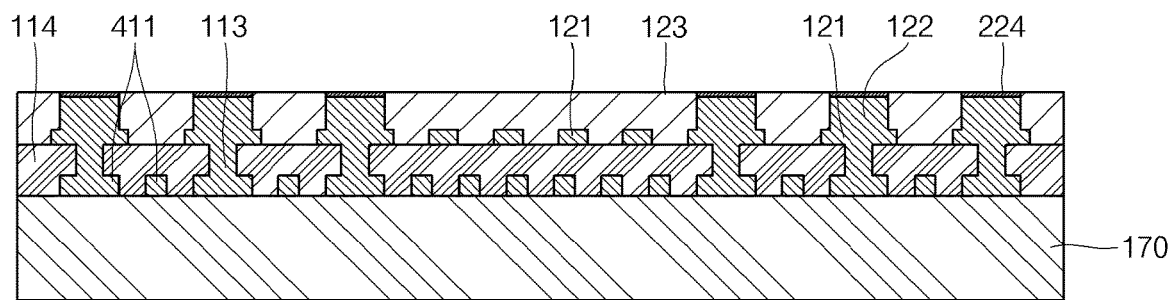
FIGS. 9A to 9C are cross-sectional views sequentially illustrating a manufacturing method of a packaged semiconductor device according to a still further embodiment of the present invention.
Figure 9B:
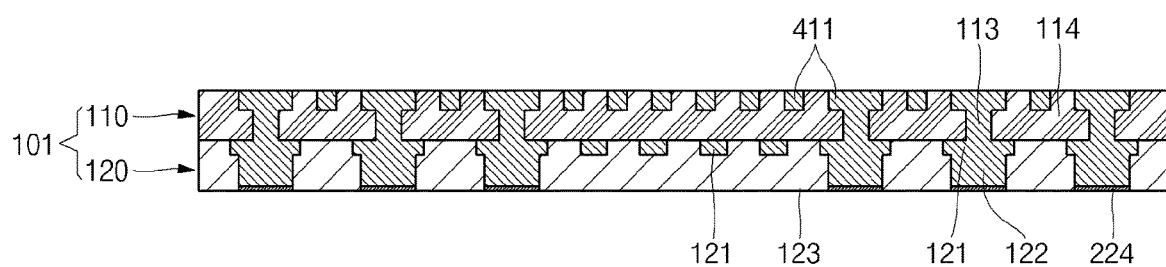
Figure 9C:
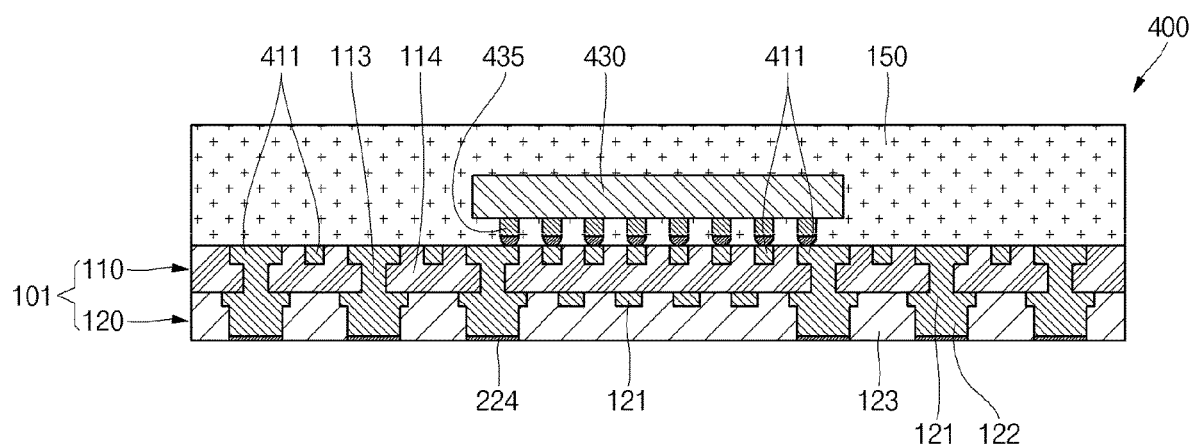

FIGS. 9A to 9C are cross-sectional views sequentially illustrating a manufacturing method for a semiconductor device 400 or packaged semiconductor device 400 having a surface finish layer according to a still further embodiment. In the present embodiment, the manufacturing steps illustrated in conjunction with FIGS. 8A to 8G may be used, and the details thereof will not be repeated again here. However, the manufacturing method for semiconductor device 400 is different from the manufacturing method for semiconductor device 300. Specifically, the first surface finish layer 411 is made of a different material. In one embodiment, the first surface finish layer 411 is made of copper (Cu) instead of silver (Ag).

As illustrated in FIG. 9A, after the steps of forming and curing the second resin layer 123 and grinding and/or etching of the second resin layer 123, a second surface finish layer 224 may further be formed on or connected to bump pads 122 exposed to the outside of the second resin layer 123. In one embodiment, the second surface finish layer 224 may be made as described previously and may comprise one or more of nickel/gold (Ni/Au), silver (Ag), tin (Sn), and equivalents thereof, but aspects of the present embodiment are not limited thereto.

As illustrated in FIG. 9B, after removing the carrier 170, a routable molded lead frame 101 is provided, which includes lead frame 101 having a first surface finish layer 411 (functioning as conductive patterns as well, as described above) exposed to the outside through the first laminated layer 110, and the second surface finish layer 224, which is exposed to the outside through the second laminated layer 120. In accordance with the present embodiment, the first surface finish layer 411 is formed at an initial stage of the manufacturing process of the routable molded lead frame 101, and the second surface finish layer 224 is formed at a final stage of the manufacturing process of the routable molded lead frame 101.

As illustrated in FIG. 9C, the semiconductor die 130 is positioned on the routable molded lead frame 101 and is electrically connected to the first surface finish layer 411 made of copper (Cu) by conductive bumps structures, such as micro bumps 435. More particularly, in the routable molded lead frame 101, the semiconductor die 130 is connected to the first surface finish layer 411 of the first laminating layer 110 in a flip-chip type configuration. In some embodiments, the semiconductor die 130 and the micro bumps 435 are encapsulated using the encapsulant 150 as described previously.

In some embodiments, conductive bumps are not separately formed on the bump pads 122, and the previously formed second surface finish layer 224 is exposed to the outside. Thus, the present embodiment provides a flip-chip routable molded lead frame land grid array package. In an alternative embodiment, conductive bumps may also be formed on the second surface finish layer 224.

From all of the foregoing, one of skill in the art can determine that in accordance with one embodiment, a semiconductor device includes a first laminated layer including a first surface finish layer, first conductive patterns connected to or spaced apart from the first surface finish layer, vias formed on the first conductive pattern, and a first resin layer covering the first surface finish layer, the first conductive patterns and the vias; a second laminated layer including second conductive patterns formed in the vias, bump pads formed on the second conductive patterns; and a second resin layer covering the first resin layer, the second conductive patterns and the bump pads; a semiconductor die connected to the first surface finish layer of the first laminated layer; and an encapsulant covering the first laminating layer and the semiconductor die.

From all of the foregoing, one of skill in the art can determine that in accordance with another embodiment, a manufacturing method of a semiconductor device includes forming a first surface finish layer on a carrier; forming first conductive patterns on each of the carrier and the first surface finish layer; forming vias on the first conductive patterns and coating a first resin layer on the carrier, the first surface finish layer, the first conductive patterns and the vias; forming second conductive patterns and bump pads on the vias and coating a second resin layer on the first resin layer, the second conductive patterns and the bump pads; removing the carrier from the first surface finish layer, the first conductive patterns and the first resin layer; and connecting a semiconductor die to the first surface finish layer and encapsulating the semiconductor die using an encapsulant.

In view of all the above, it is evident that a novel method of fabricating a semiconductor package using a routable encapsulated conductive substrate as well as the structure have been disclosed. Including, among other features, the routable encapsulated conductive substrate includes a first conductive structure encapsulated within a first resin layer; a second conductive structure encapsulated within a second resin layer; and a surface finish layer disposed on at least portions of the first conductive structure. The surface finish layer is exposed in the first resin layer, the first conductive structure is electrically connected to the second conductive structure, and at least portions of the second conductive structure are exposed to the outside of the second resin layer. A semiconductor die is electrically coupled to the surface finish layer, and an encapsulant covers the semiconductor die and the first surface finish layer. The routable encapsulated conductive substrate facilitates efficient routing of package level embedded conductive patterns, and surface finish layer provides enhanced connection reliability between the routable encapsulated conductive substrate and a semiconductor die. In addition, the routable encapsulated conductive substrate supports the demand for miniaturization and higher performance electronic devices, supports various interconnect schemes for next levels of assembly, may be manufactured in advance of further assembly steps to reduce manufacturing cycle time, may be easily incorporated into manufacturing flows, and is cost effective.

While the present invention has been particularly shown and described with reference to exemplary embodiments thereof, it will be understood by those of ordinary skill in the art that various changes in form and details may be made therein without departing from the spirit and scope of the present invention as defined by the following claims.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method of manufacturing a semiconductor device, comprising:
    providing a routable encapsulated conductive substrate comprising:
        a first conductive structure encapsulated within a first laminated layer, wherein the first laminated layer has a first thickness and the first conductive structure is entirely within the first thickness;
        a second conductive structure encapsulated within a second laminated layer, wherein the second laminated layer has a second thickness and the second conductive structure is entirely within the second thickness; and
        a first surface finish layer disposed on at least portions of the first conductive structure, wherein:
        the first laminated layer and the second laminated layer form an interface;
        the first conductive structure and the second conductive structure meet at the interface;
        the first surface finish layer is exposed from the first laminated layer;
        first at least portions of the second conductive structure are exposed in the second laminated layer and recessed inward from a bottom side of the second laminated layer; and
        second portions of the second conductive structure are substantially co-planar with the interface; and
    conductive bumps attached to the first portions of the second conductive structure;
    electrically coupling a semiconductor component to the first surface finish layer; and
    forming a package body covering the semiconductor component and the first surface finish layer;
    wherein providing the routable encapsulated conductive substrate comprises in the following order:
    first, providing the first surface finish layer on a carrier;
    second, providing the first conductive structure comprising first conductive patterns on both the first surface finish layer and on the carrier where the carrier is devoid of the first surface finish layer and conductive vias on at least portions of the first conductive patterns;
    third, providing the first laminated layer covering the carrier, the first surface finish layer, the first conductive patterns, and the conductive vias so that the first surface finish layer, the first conductive patterns, and the conductive vias are entirely within the first thickness;
    fourth, providing the second conductive structure comprising second conductive patterns and conductive pads connected to the conductive vias;
    fifth, providing the second laminated layer covering the first laminated layer, the second conductive patterns and the conductive pads;
    subsequently, (a) and (b) in either order:
    (a):
        (a1) recessing the first portions of the conductive pads inward from the bottom side of the second laminated layer; and
        (a2) attaching the conductive bumps directly to the recessed conductive pads; and
    (b) removing the carrier to expose the first surface finish layer.

2. The method of claim 1, wherein:
    the second providing includes removing a portion of the first laminated layer to expose the conductive vias from the first laminated layer before the fourth providing;
    the first providing comprises providing the first surface finish layer comprising one or more of nickel/gold (Ni/Au), silver (Ag) or copper (Cu); and
    the method further comprises after removing the carrier, recessing surfaces of at least portions of the first conductive patterns below a major surface of the first laminated layer while leaving the first surface finish layer substantially coplanar with the major surface of the first laminated layer.

3. The method of claim 1 further comprising:
    removing a portion of the second laminated layer to expose the conductive pads from the second laminated layer; and
    forming a second surface finish layer connected to the conductive pads, wherein:
        the second surface finish layer comprise one or more of nickel/gold (Ni/Au), silver (Ag) or tin (Sn); and
        the second surface finish layer is substantially coplanar with a major surface of the second laminated layer.

4. The method of claim 1, wherein:
    electrically coupling the semiconductor component comprises coupling with conductive bumps in a flip-chip configuration.

5. A method of manufacturing a semiconductor device, comprising:
    providing a routable encapsulated conductive substrate comprising:
        a first conductive structure encapsulated within a first laminated layer, wherein:
        the first conductive structure comprises:
            a first surface finish layer;
            a first conductive pattern; and
            first conductive vias coupled to at least a portion of the first surface conductive pattern;
        the first laminated layer defines a top substrate surface of the routable encapsulated conductive substrate and has a first thickness;
        the first conductive structure is entirely within the first thickness of the first laminated layer; and
        the first surface finish structure is exposed from the top substrate surface;
    a second conductive structure electrically coupled to the first conductive vias and encapsulated within a second laminated layer, wherein:
        the second conductive structure comprises:
            a second conductive pattern; and
            conductive pads connected to the second conductive pattern; and
        the second laminated layer defines a bottom substrate surface of the routable encapsulated conductive substrate;

the second laminated layer covers a portion of the first laminated layer; and
lower surfaces of the conductive pads proximate to the bottom substrate surface are devoid of the second laminated layer;
electrically coupling a semiconductor device to the first surface finish structure; and
providing a package body covering the semiconductor device, at least portions of the first surface finish layer, and at least portions of the top substrate surface;
wherein providing the routable encapsulated conductive substrate comprises in the following order;
first, providing the first surface finish layer on a carrier;
second, providing the first conductive pattern having a first portion directly on the carrier and a second portion on the first surface finish layer;
third, providing the first conductive vias on at least portions of the first conductive pattern;
fourth, providing the first laminated layer covering the carrier, the first surface finish layer, the first conductive pattern, and the first conductive vias so that the first surface finish layer, the first conductive pattern, and the first conductive vias are entirely within the first thickness;
fifth, providing the second conductive pattern on the conductive vias;
sixth, providing the conductive pads connected to at least a portion of the second conductive pattern;
seventh, providing the second laminated layer covering the first laminated layer, the second conductive pattern and the conductive pads; and
subsequently, removing the carrier.

6. The method of claim 5, wherein:
the first providing comprises providing the first surface finish layer comprising a first material; and
the third providing comprises providing first conductive vias comprising a second material that is different than the first material.

7. The method of claim 5, wherein:
the fourth providing comprises providing the first portion of the first conductive pattern and the first surface finish layer substantially coplanar with the substrate top surface.

8. The method of claim 5, wherein:
the fourth providing comprises providing the first surface finish layer substantially coplanar with the top substrate surface;
after the seventh providing, providing surfaces of the conductive pads recessed within opening in the second laminated layer; and
then directly attaching conductive bumps to the surfaces of the conductive pads in the recessed openings.

9. The method of claim 5, wherein:
electrically coupling the semiconductor device comprises electrically coupling the semiconductor device to the first surface finish layer with conductive bumps in a flip-chip configuration.

10. The method of claim 5, wherein:
the first providing comprises providing the first surface finish layer comprising silver (Ag); and
the third providing comprises providing the first conductive vias comprising copper (Cu).

11. The method of claim 5, wherein:
the first providing comprises providing the first surface finish layer having a first width;

the second providing comprises providing the first conductive patterns have a second width adjacent to the first surface finish layer; and
the second width is equal to the first width.

12. The method of claim 5, wherein:
the sixth providing comprises leaving a portion of the second conductive pattern devoid of the conductive pads.

13. The method of claim 5, wherein providing the routable encapsulated conductive substrate comprises:
providing a second surface finish layer coupled to the conductive pads.

14. The method of claim 13, wherein providing the second surface finish layer comprises:
providing the second surface finish layer comprising one or more of nickel/gold (Ni/Au), silver (Ag) or tin (Sn).

15. A method of manufacturing a semiconductor device, comprising:
providing a routable encapsulated conductive substrate comprising:
a first conductive structure encapsulated within a first laminated layer, wherein:
the first conductive structure comprises:
a surface finish layer;
a first conductive pattern; and
first conductive vias coupled to at least a portion of the first surface conductive pattern;
the first laminated layer defines a top substrate surface of the routable encapsulated conductive substrate and has a first thickness;
the first conductive structure is entirely within the first thickness of the first laminated layer;
part of the first conductive pattern and the surface finish layer are exposed from and substantially coplanar with the top substrate surface;
a second conductive structure coupled to the first conductive vias and encapsulated within a second laminated layer, wherein:
the second conductive structure comprises:
a second conductive pattern; and
conductive pads connected to the second conductive pattern; and
the second laminated layer defines a bottom substrate surface of the routable encapsulated conductive substrate;
the second laminated layer covers a portion of the first laminated layer; and
lower surfaces of the conductive pads proximate to the bottom substrate surface are devoid of the second laminated layer and recessed inward from the bottom substrate surface; and
electrically coupling a semiconductor device to the first surface finish structure; and
attaching conductive bumps to the recessed lower surfaces of the conductive pads.

16. The method of claim 15, further comprising:
providing a package body covering the semiconductor device, at least portions of the first surface finish layer, and at least portions of the top substrate surface before attaching the conductive bumps.

17. The method of claim 15, wherein:
electrically coupling the semiconductor device comprises:
providing the semiconductor device having a semiconductor device top side and a semiconductor device bottom side opposite to the semiconductor device top side;

attaching the semiconductor device bottom side to the top substrate surface with an attachment material;

coupling conductive interconnects to the semiconductor device top side and the first surface finish layer.

18. The method of claim 15, wherein providing the routable conductive substrate comprises in the following order:

first, providing the surface finish layer on a carrier;

second, providing the first conductive pattern having a first portion directly on the carrier and a second portion on the surface finish layer;

third, providing the first conductive vias on at least portions of the first conductive pattern;

fourth, providing the first laminated layer covering the carrier, the first surface finish layer, the first conductive pattern, and the first conductive vias so that the surface finish layer, the first conductive pattern, and the first conductive vias are entirely within the first thickness and the surface finish layer and the part of the first conductive pattern are exposed from and substantially coplanar with the top substrate surface;

fifth, providing the second conductive pattern connected to the conductive vias;

sixth, providing the conductive pads connected to at least a portion of the second conductive pattern;

seventh, providing the second laminated layer covering the first laminated layer, the second conductive pattern and the conductive pads;

eighth, recessing the conductive pads; and subsequently, removing the carrier.

19. The method of claim 18, wherein:

the first providing comprises providing the surface finish layer comprising nickel/gold (Ni/Au), silver (Ag) or copper (Cu).

* * * * *